(12) United States Patent
Park

(10) Patent No.: US 10,014,491 B2
(45) Date of Patent: Jul. 3, 2018

(54) ORGANIC LIGHT-EMITTING DIODE DISPLAY AND MANUFACTURING METHOD THEREOF

(71) Applicant: Samsung Display Co., Ltd., Yongin-si, Gyeonggi-do (KR)

(72) Inventor: Dong-Seop Park, Pyeongtaek-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/254,777

(22) Filed: Sep. 1, 2016

(65) Prior Publication Data

US 2017/0117502 A1    Apr. 27, 2017

(30) Foreign Application Priority Data

Oct. 22, 2015    (KR) ........................ 10-2015-0147360

(51) Int. Cl.
*H01L 51/52* (2006.01)
*H01L 27/32* (2006.01)
*H01L 51/56* (2006.01)
*H01L 51/00* (2006.01)

(52) U.S. Cl.
CPC ...... *H01L 51/5253* (2013.01); *H01L 27/3244* (2013.01); *H01L 27/3246* (2013.01); *H01L 51/5246* (2013.01); *H01L 51/5293* (2013.01); *H01L 51/56* (2013.01); *H01L 51/0097* (2013.01); *H01L 2227/323* (2013.01)

(58) Field of Classification Search
CPC ............. H01L 27/3244; H01L 27/3246; H01L 51/5246; H01L 51/5253; H01L 51/5293; H01L 51/56
See application file for complete search history.

(56) References Cited

U.S. PATENT DOCUMENTS

| 7,323,817 | B2 * | 1/2008 | Shitagami | ........... | H01L 27/3223 |
| | | | | | 313/504 |
| 2005/0179377 | A1 * | 8/2005 | Shitagami | ........... | H01L 27/3223 |
| | | | | | 313/512 |
| 2014/0319474 | A1 * | 10/2014 | Kim | .................... | H01L 51/5256 |
| | | | | | 257/40 |

(Continued)

FOREIGN PATENT DOCUMENTS

| KR | 10-2005-0033293 A | 4/2005 |
| KR | 10-2007-0045880 A | 5/2007 |
| KR | 10-2015-0038950 A | 4/2015 |

*Primary Examiner* — Allan R Wilson
(74) *Attorney, Agent, or Firm* — Knobbe Martens Olson & Bear LLP

(57) ABSTRACT

An organic light-emitting diode display and a method of manufacturing the same are disclosed. In one aspect, the OLED display includes a substrate including a display area configured to display an image, a peripheral area surrounding the display area, and an edge portion disposed at the peripheral area and having a curved shape or an angular shape. The display also includes a plurality of pixels disposed at the display area and including a plurality of transistors and a plurality of insulating layers disposed over the transistors. The display further includes a thin film encapsulation layer covering the pixels in the display area and at least a portion of the peripheral area, and a stress distribution portion disposed at the edge portion and including at least one of the insulating layers.

14 Claims, 15 Drawing Sheets

(56) References Cited

U.S. PATENT DOCUMENTS

| | | |
|---|---|---|
| 2015/0015834 A1 | 1/2015 | Yim et al. |
| 2015/0060790 A1* | 3/2015 | Kim ................... H01L 51/5246 257/40 |
| 2015/0070840 A1 | 3/2015 | Rappoport et al. |
| 2016/0035997 A1* | 2/2016 | Oh ..................... H01L 51/5246 257/40 |
| 2016/0066409 A1* | 3/2016 | Kwon .................. H05K 1/028 174/254 |
| 2016/0126300 A1* | 5/2016 | Su ...................... H01L 27/3276 257/40 |
| 2016/0164027 A1* | 6/2016 | Jeon ................... H01L 51/5246 257/40 |
| 2017/0110526 A1* | 4/2017 | Eo ...................... H01L 27/3258 |

* cited by examiner

ORGANIC LIGHT-EMITTING DIODE DISPLAY AND MANUFACTURING METHOD THEREOF

CROSS-REFERENCE TO RELATED APPLICATION

This application claims priority to and the benefit of Korean Patent Application No. 10-2015-0147360 filed in the Korean Intellectual Property Office on Oct. 22, 2015, the entire contents of which are incorporated herein by reference.

BACKGROUND

Field

The described technology generally relates to an organic light-emitting diode (OLED) display and a manufacturing method thereof.

Description of the Related Technology

Examples of display devices include liquid crystal displays (LCDs), OLED displays, and the like. A display panel of the LCD includes a liquid crystal (LC) layer performing a phase delay function based on a driving voltage. The liquid crystal layer is interposed between an upper substrate and a lower substrate which are sealed.

The OLED display does not need a separate LC layer or a backlight unit, and each OLED pixel circuit of an OLED display panel includes an OLED. Accordingly, unlike an LCD, the OLED display panel does not need an upper substrate for sealing, and it can protect the OLED, the pixel circuit, etc. by using a thin film encapsulation layer. As such, the thickness of the display device can be thin.

However, in an OLED display panel in a smart watch and the like, a portion on which stress is concentrated can be damaged during a rolling lamination process of pressing the display panel with parts such as a polarizer, a window, etc. When the display panel is damaged, the thin film encapsulation layer can also be damaged to not properly prevent moisture-permeation of external air, thereby damaging the OLED and the pixel circuit.

The above information disclosed in this Background section is only to enhance the understanding of the background and therefore it may contain information that does not constitute the prior art that is already known in this country to a person of ordinary skill in the art.

SUMMARY OF CERTAIN INVENTIVE ASPECTS

One inventive aspect relates to an OLED display and a manufacturing method thereof that can prevent the OLED display from being damaged by an external force.

Another aspect is an OLED display including: a substrate that includes a display area for displaying an image, a peripheral area disposed outside of the display area, and an edge portion which is disposed at the peripheral area and has a curved surface shape or an angular shape; a plurality of pixels that are disposed at the display area and include a plurality of transistors and a plurality of insulating layers disposed on the plurality of transistors; a thin film encapsulation that covers the plurality of pixels in the display area and at least some of the peripheral area; and a stress distribution portion that is disposed at the edge portion and includes the same layer as at least one of the plurality of insulating layers.

The plurality of pixels can include a plurality of OLEDs, and the plurality of insulating layers can include: a passivation layer disposed between an electrode of the plurality of transistors and an anode of the plurality of OLEDs; and a pixel defining layer for partitioning the plurality of pixels.

The OLED display can further include: a gate insulating layer disposed between a semiconductor layer and a gate electrode of the plurality of transistors; and an interlayer insulating layer disposed on the gate electrode and the gate insulating layer, wherein at least one of the gate insulating layer and the interlayer insulating layer can cover at least some of the edge portion and can include an opening disposed at the at least some of the edge portion.

A plurality of the stress distribution portions and the openings can exist, each stress distribution portion can be disposed to be surrounded by the plurality of openings, and each opening can be disposed to be surrounded by the plurality of stress distribution portions.

The plurality of openings can be disposed in a direction forming a first angle based on a first direction toward the edge portion from a center of the substrate to form a plurality of first arrays, and the plurality of stress distribution portions can be disposed in a direction forming a second angle based on the first direction to form a plurality of second arrays.

The plurality of first arrays and the plurality of second arrays can be alternately disposed along a second direction perpendicular to the first direction.

The edge portion can include a crack preventing portion that is disposed outside of the gate insulating layer and the interlayer insulating layer and includes a metal pattern, the stress distribution portion can be disposed in at least one of a first stress distribution region and a second stress distribution region, the first stress distribution region can be a region disposed between the crack preventing portion and the thin film encapsulation, and the second stress distribution region can be a region disposed between the crack preventing portion and an edge of the substrate.

The OLED display can further include a polarizer disposed on the thin film encapsulation, wherein at least some of the polarizer can overlap the first stress distribution region.

The OLED display can further include a polarizer disposed on the thin film encapsulation, wherein at least some of the polarizer overlaps the stress distribution portion.

The edge portion can include a recess portion disposed at a periphery of the stress distribution portion.

Another aspect is a manufacturing method of an OLED display, including: forming a plurality of transistors in a display area of a substrate that includes an edge portion having a curved surface shape or an angular shape; forming a plurality of insulating layers on the plurality of transistors and then forming a plurality of pixels including the plurality of transistors and the plurality of insulating layers; forming a stress distribution portion including the same layer as at least one of the plurality of insulating layers at the edge portion; and forming a thin film encapsulation that covers the plurality of pixels in the display area and covers at least some of a peripheral area disposed outside of the display area.

The plurality of pixels can include a plurality of OLEDs, and the plurality of insulating layers can include: a passivation layer disposed between an electrode of the plurality of transistors and an anode of the plurality of OLEDs; and a pixel defining layer for partitioning the plurality of pixels.

The forming of the plurality of transistors can include: forming a gate insulating layer on a semiconductor layer of the plurality of transistors; forming the gate electrode layer on the gate insulating layer; forming an interlayer insulating layer on the gate insulating layer and the gate electrode layer; and forming an opening in a region in which the edge portion is disposed in at least one of the gate insulating layer and the interlayer insulating layer.

A plurality of the stress distribution portions and the openings can exist, the stress distribution portion can be formed to be surrounded by the plurality of openings, and the opening can be formed to be surrounded by the plurality of stress distribution portions.

The plurality of openings can be disposed in a direction forming a first angle based on a first direction toward the edge portion from a center of the substrate to form a plurality of first arrays, and the plurality of stress distribution portions can be disposed in a direction forming a second angle based on the first direction to form a plurality of second arrays.

The manufacturing method of an OLED display can further include forming a crack preventing portion including a metal pattern at the edge portion, wherein the stress distribution portion can be disposed in at least one of the first stress distribution region and the second stress distribution region, the first stress distribution region can be disposed between the crack preventing portion and the thin film encapsulation, and the second stress distribution region can be disposed between the crack preventing portion and an edge of the substrate.

The manufacturing method of an OLED display can further include stacking a polarizer on the thin film encapsulation, wherein at least some of the polarizer overlaps the first stress distribution region.

The manufacturing method of an OLED display can further include stacking a polarizer on the thin film encapsulation, wherein at least some of the polarizer overlaps the stress distribution portion.

Another aspect is an organic light-emitting diode (OLED) display, comprising: a substrate including a display area configured to display an image, a peripheral area surrounding the display area, and an edge portion disposed at the peripheral area and having a curved shape or an angular shape; a plurality of pixels disposed at the display area and including a plurality of transistors and a plurality of insulating layers disposed over the transistors; a thin film encapsulation layer covering the pixels in the display area and at least a portion of the peripheral area; and a stress distribution portion disposed at the edge portion and including at least one of the insulating layers.

In the above OLED display, the pixels include a plurality of OLEDs, and wherein the insulating layers include: a passivation layer disposed between the transistors and the OLEDs; and a pixel defining layer that define the pixels.

In the above OLED display, the transistors include a plurality of gate electrodes, the OLED display further comprising: a semiconductor layer formed over the substrate; a gate insulating layer disposed between the semiconductor layer and the gate electrodes; and an interlayer insulating layer disposed over the gate electrodes and the gate insulating layer, wherein at least one of the gate insulating layer and the interlayer insulating layer at least partially covers the edge portion and includes an opening disposed at the partially covered area of the edge portion.

In the above OLED display, the opening comprises a plurality of openings, wherein the stress distribution portion comprises a plurality of stress distribution portions and the openings, wherein each of the stress distribution portions is surrounded by at least two of the openings, and wherein each of the openings is surrounded by at least two of the stress distribution portions.

In the above OLED display, the opening comprises a plurality of openings, wherein the substrate includes a buffer layer and an inorganic layer, wherein the edge portion includes a recess portion disposed at a periphery of the stress distribution portion and including the openings, and wherein the recess portion is formed in the buffer layer and the inorganic layer.

In the above OLED display, the openings are arranged in a plurality of first arrays and disposed in a direction that forms a first angle with a first direction, wherein the stress distribution portions are arranged in a plurality of second arrays and disposed in a direction that forms a second angle with the first direction.

In the above OLED display, the first and second arrays are alternately disposed along a direction crossing the first direction.

In the above OLED display, the edge portion includes a crack preventing portion disposed adjacent to the gate and interlayer insulating layers and includes a metal pattern, wherein each of the stress distribution portions is disposed in at least one of a first stress distribution region and a second stress distribution region, wherein the first stress distribution region is disposed between the crack preventing portion and the thin film encapsulation layer, and wherein the second stress distribution region is disposed between the crack preventing portion and an edge of the substrate.

The above OLED display further comprises a polarizer disposed over the thin film encapsulation layer, wherein at least a portion of the polarizer overlaps the first stress distribution region in the depth dimension of the OLED display.

In the above OLED display, the stress distribution portions in the first stress distribution region are taller than the stress distribution portions in the second stress distribution region.

In the above OLED display, the first stress distribution region is closer to the display area than the second stress distribution region.

In the above OLED display, the first stress distribution region includes the interlayer insulating layer, wherein the second stress distribution region does not include the interlayer insulating layer.

In the above OLED display, the first stress distribution region includes the gate insulating layer, wherein the second stress distribution region does not include the gate insulating layer.

The above OLED display further comprises a polarizer disposed over the thin film encapsulation layer, wherein at least a portion of the polarizer overlaps the stress distribution portion in the depth dimension of the OLED display.

Another aspect is a method of manufacturing an organic light-emitting diode (OLED) display, the method comprising: forming a plurality of transistors in a display area of a substrate, wherein the substrate includes an edge portion having a curved shape or an angular shape; forming a plurality of insulating layers over the transistors; forming a plurality of pixels including the transistors and the insulating layers; forming a stress distribution portion including at least one of the insulating layers at the edge portion; and forming a thin film encapsulation layer covering the pixels in the display area and at least a portion of a peripheral area surrounding the display area.

In the above method, the pixels include a plurality of OLEDs, and wherein the insulating layers include: a passivation layer disposed between the transistors and the OLEDs; and a pixel defining layer defining the pixels.

In the above method, the forming of the transistors includes: forming a gate insulating layer over a semiconductor layer of the transistors; forming a gate electrode layer over the gate insulating layer; forming an interlayer insulating layer over the gate insulating layer and the gate electrode layer; and forming an opening in a region in which the edge portion is disposed in at least one of the gate insulating layer and the interlayer insulating layer.

In the above method, the opening comprises a plurality of openings, wherein the stress distribution portion comprises a plurality of stress distribution portions and the openings, wherein the stress distribution portion is surrounded by at least two of the openings, and wherein each of the openings is surrounded by at least two of the stress distribution portions.

In the above method, the openings are arranged in a plurality of first arrays and disposed in a direction that forms a first angle with a first direction, wherein and wherein the stress distribution portions are arranged in a plurality of second arrays and disposed in a direction that forms a second angle with the first direction.

The above method further comprises forming a crack preventing portion including a metal pattern at the edge portion, wherein the stress distribution portion is disposed in at least one of a first stress distribution region and a second stress distribution region, wherein the first stress distribution region is disposed between the crack preventing portion and the thin film encapsulation layer, and wherein the second stress distribution region is disposed between the crack preventing portion and an edge of the substrate.

The above method further comprises stacking a polarizer over the thin film encapsulation layer, wherein at least a portion of the polarizer overlaps the first stress distribution region in the depth dimension of the OLED display.

The above method further comprises stacking a polarizer over the thin film encapsulation layer, wherein at least a portion of the polarizer overlaps the stress distribution portion in the depth dimension of the OLED display.

According to at least one of the disclosed embodiments, it is possible to prevent an OLED display from being damaged by an external force during a manufacturing process of the OLED display.

DETAILED DESCRIPTION OF CERTAIN INVENTIVE EMBODIMENTS

Figure 1A:
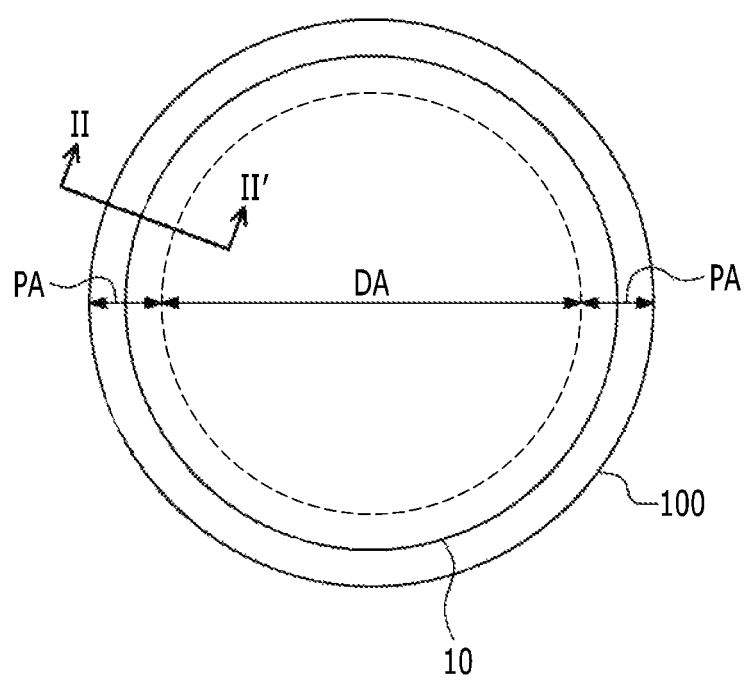
FIG. 1A illustrates a schematic top plan view of a display panel of a circular OLED display according to one exemplary embodiment.

The present disclosure will be described more fully hereinafter with reference to the accompanying drawings, in which exemplary embodiments are shown. As those skilled in the art would realize, the described embodiments can be modified in various different ways, all without departing from the spirit or scope of the present disclosure.

To clearly describe the present disclosure, parts that are irrelevant to the description are omitted, and like numerals refer to like or similar constituent elements throughout the specification.

Further, in the drawings, the size and thickness of each element are arbitrarily illustrated for ease of description, and the present disclosure is not necessarily limited to those illustrated in the drawings. In the drawings, the thickness of layers, films, panels, regions, etc. are exaggerated for clarity. In the drawings, for ease of description, the thicknesses of some layers and regions are exaggerated.

In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1B:
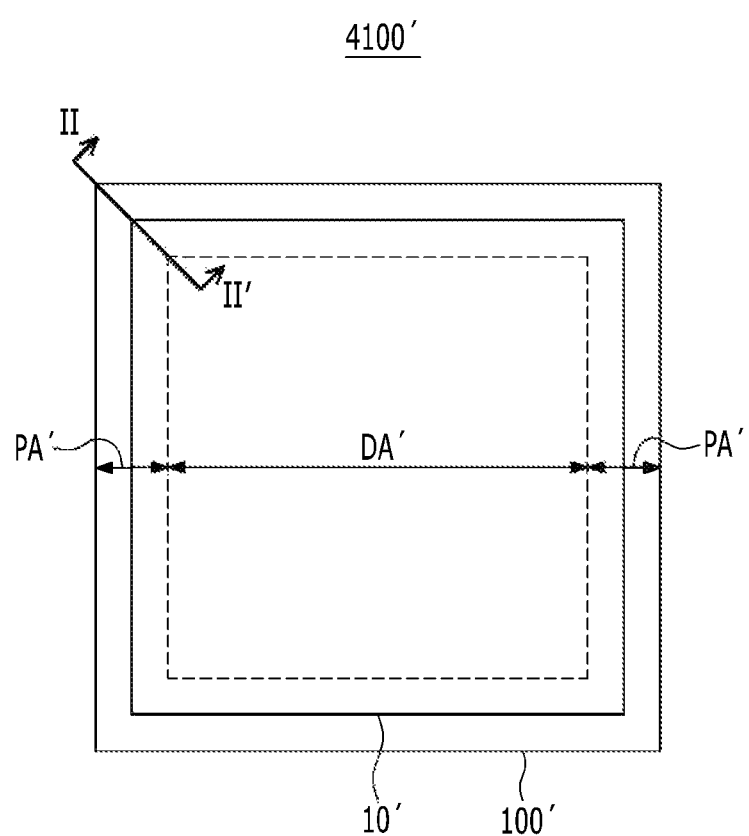
FIG. 1B illustrates a schematic top plan view of a display panel of a quadrangular OLED display according to another exemplary embodiment.

FIG. 1A illustrates a schematic top plan view of a display panel 4100 of a substantially circular OLED display according to one exemplary embodiment. FIG. 1B illustrates a schematic top plan view of a display panel 4100' of a substantially quadrangular OLED display according to another exemplary embodiment.

Referring to FIG. 1A, the display panel 4100 includes a substrate 100. The substrate 100 includes a display area DA for displaying an image, and a peripheral area PA disposed outside of the display area DA.

A thin film encapsulation layer 10 covers a plurality of pixels in the display area DA and at least some of regions except for an edge portion in the peripheral area PA. The edge portion will be described in detail later with reference to FIG. 2.

Referring to FIG. 1B, the display panel 4100' includes a substrate 100'. The substrate 100' includes a display area DA' for displaying an image and a peripheral area PA' disposed outside of the display area DA'.

A thin film encapsulation layer 10' covers a plurality of pixels in the display area DA' and at least some of regions except for an edge portion in the peripheral area PA'.

A display panel can be the circular display panel 4100 shown in FIG. 1A or the quadrangular display panel 4100' shown in FIG. 1B. In another exemplary embodiment, the display panel can be oval. Further, the display panel can be polygonal other than quadrangular. In addition, the display panel can be substantially quadrangular including four curved corners.

As will be described in detail later with reference to FIGS. 11A and 11B, the current exemplary embodiment can be applied to display panels having edge portions with curved surfaces or angular portions on which stress can be concentrated during a rolling lamination process. For example, when a substrate of the display panel includes an edge portion with the curved surface or the angular portion, the current exemplary embodiment can be applied to any type of the OLED display. The substrate 100 of FIG. 1A is an example having an edge portion with the curved surface, and the substrate 100' of FIG. 1B is an example having an edge portion with the angular surface.

Figure 2:
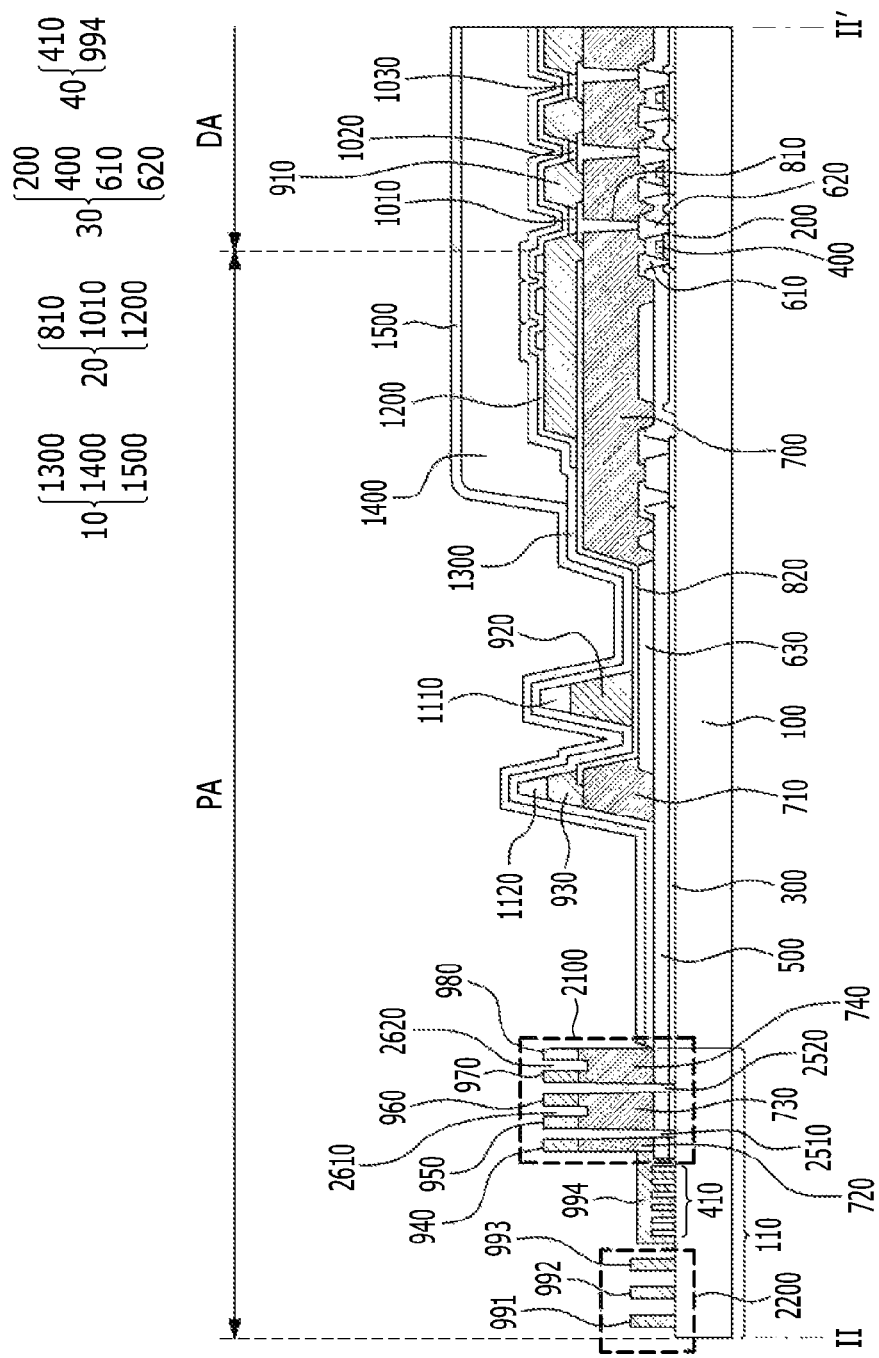
FIG. 2 illustrates a cross-sectional view of the display panel of FIG. 1A or FIG. 1B taken along line II-II'.

FIG. 2 illustrates a cross-sectional view of the display panel 4100 or 4100' of FIG. 1A or FIG. 1B taken along line II-II'. For better comprehension and ease of description, FIG. 2 will be described based on the display panel 4100 of the circular OLED display of FIG. 1A.

The substrate 100 can be a flexible substrate in which an organic layer and an inorganic layer are alternately stacked. For example, the substrate 100 has a structure in which an organic layer including a polyimide (PI), an inorganic layer formed of a silicon oxide (SiOx) which is a first barrier layer (first barrier) disposed on the organic layer, and an organic layer formed of a polyimide on the inorganic layer are stacked. In addition, the substrate 100 can further include an inorganic layer formed of a silicon nitride (SiNx) or a silicon oxide (SiOx) which is a second barrier layer on the organic layer, and a buffer layer stacked on the inorganic layer. The buffer layer blocks impurities from the substrate 100 during a crystallization process of a semiconductor layer 200 to be formed on the substrate 100 to serve to improve characteristics of the semiconductor layer 200 and reduce stress applied to the substrate 100. Although the substrate 100 including the semiconductor layer 200 can be described, since the semiconductor layer 200 outside the display area DA can be formed to have a negligible thin thickness, the semiconductor layer 200 will now be described as being included in a transistor in the display area DA of the substrate 100.

The stacked structure of the substrate 100 is an example, and can be variously modified. In another exemplary embodiment, the substrate 100 is formed of glass.

The peripheral area PA of the substrate 100 includes an edge portion 110. In another exemplary embodiment, the substrate, as in the aforementioned quadrangular substrate 100' of FIG. 1B, can include an angular edge portion.

The thin film encapsulation (TFE) layer 10 covers a plurality of pixels in the display area DA, and covers at least some of regions except for an edge portion 110 in the peripheral area PA.

The thin film encapsulation layer 10 can have a structure in which an organic layer and an inorganic layer are alternately stacked. In the current exemplary embodiment, the thin film encapsulation layer 10 has a structure in which an inorganic layer 1300, an organic layer 1400, and an inorganic layer 1500 are stacked. The number and thickness of the respective inorganic and organic layers are not limited.

The inorganic layers 1300 and 1500 prevent moisture-permeation from external air. The organic layer 1400 acts as a buffer between the inorganic layer 1300 and the inorganic layer 1500 to prevent the inorganic layers 1300 and 1500 from being damaged due to impurities or process residues. The thin film encapsulation layer 10 prevents the pixels disposed in the display area DA from being damaged.

Each of the pixels includes a transistor 30 and an OLED 20 controlled by the transistor 30.

The transistor 30 includes a semiconductor layer 200 serving as a channel, a gate electrode 400 which is a control electrode opening or closing the channel, and a source electrode 610 and a drain electrode 620 respectively connected to opposite ends of the channel. The source electrode 610 and the drain electrode 620 can be interchangeable depending on a kind of impurities doped into the semiconductor layer 200.

The OLED 20 includes an anode 810, an organic emission layer 1010, and a cathode 1200.

The pixel includes a plurality of insulating layers between the transistor 30 and the cathode 1200. The insulating layers can include a passivation layer 700 and a pixel defining layer 910. The pixel defining layer 910 can partition a plurality of pixels.

A detailed structure of the transistor 30 and the OLED 20 will be described together with description of the stacked structure of the display panel 4100.

The semiconductor layer 200 is disposed on the substrate 100 and can form the channel of the transistor 30. The semiconductor layer 200 can include a channel that is channel-doped with an N-type impurity or a P-type impurity, and a source doping region and a drain doping region that are formed on opposite sides of the channel and have a higher doping concentration than that of a doping impurity that is doped on the channel. Further, in the semiconductor layer 200, regions disposed between source doping regions and drain doping regions of different transistors can be doped to electrically connect the different transistors.

The semiconductor layer 200 can be formed of a polysilicon (poly-Si) or oxide semiconductor. The oxide semiconductor can include one of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). When the semiconductor layer 200 is formed of the oxide semiconductor, a separate passivation layer can be added to protect the oxide semiconductor, which is vulnerable to an external environment such as high temperature and the like.

A gate insulating layer 300 is disposed on the semiconductor layer 200. The gate insulating layer 300 is provided to insulate the gate electrode 400 from the semiconductor layer 200. The gate insulating layer 300 can be formed of an inorganic material, and the inorganic material can include a silicon nitride (SiNx) or a silicon oxide (SiOx).

The gate insulating layer 300 can be disposed in the display area DA and the peripheral area PA, but may not be disposed on the entire substrate 100. In the current exemplary embodiment, the gate insulating layer 300 is disposed to the front of a crack preventing portion 40.

When an impact such as from bending is applied to the display panel 4100, the crack preventing portion 40 serves to prevent a crack from occurring. The crack preventing portion 40 can include a metal pattern 410 and an insulating layer 994.

When the gate electrode 400 disposed on the gate insulating layer 300 is formed, the metal pattern 410 can be substantially simultaneously formed of the same material as the gate electrode 400. Accordingly, the metal pattern 410 can be formed of one of molybdenum (Mo), a molybdenum alloy, copper (Cu), a copper alloy, aluminum (Al), and an aluminum alloy. In another exemplary embodiment, when data electrode layers 610, 620, and 630 are formed, the metal pattern 410 can be substantially simultaneously be formed of the same material as the data electrode layers 610, 620, and 630. The metal pattern 410 is not limited in its structure, and can have a serpentine pattern such as a zigzag form. Accordingly, when the impact such as from bending is applied thereto, the metal pattern 410 that has a relatively long length can absorb the impact. FIG. 2 illustrates a cross-sectional view taken along the center line of the metal pattern 410 with the zigzag pattern. The insulating layer 994 can be substantially simultaneously formed when at least one of the passivation layer 700 and the pixel defining layer 910 is formed.

The gate electrode 400 of the transistor can be formed of one of molybdenum (Mo), a molybdenum alloy, copper (Cu), a copper alloy, aluminum (Al), and an aluminum alloy.

An interlayer insulating layer 500 is disposed on the gate electrode 400. The interlayer insulating layer 500 insulate the gate electrode 400 from the data electrode layers 610, 620, and 630. The interlayer insulating layer 500 can be formed of an inorganic material, and the inorganic material can include a silicon nitride (SiNx) or a silicon oxide (SiOx).

The gate insulating layer 300 and the interlayer insulating layer 500 include a contact hole, and the source electrode 610 and the drain electrode 620 contact the source doping region and the drain doping region of the semiconductor layer 200 through the contact hole of the gate insulating layer 300 and the interlayer insulating layer 500. The edge portion 110 includes openings 2510 and 2520, and the openings 2510 and 2520 can be formed together with the contact hole of the gate insulating layer 300 and the interlayer insulating layer 500. The openings 2510 and 2520 interact with a stress distribution portion (described later) and can distribute stress applied to the display panel 4100. In the current exemplary embodiment, it is illustrated that the openings 2510 and 2520 are formed in the gate insulating layer 300 and the interlayer insulating layer 500, while in another exemplary embodiment, a recess portion is formed in the buffer layer and the second barrier layer included in the substrate 100, so the depths of the openings 2510 and 2520 can be deepened more by the recess portion. This will be described in detail with reference to FIG. 6B.

The data electrode layers 610, 620, and 630 are disposed on the interlayer insulating layer 500. As described above, the source and drain electrodes 610 and 620, which are components of the transistor 30, respectively contact the source and drain doping regions of the semiconductor layer 200 through the contact hole. The electrode 630 is electrically connected to the cathode 1200 described later to supply a power source voltage. The data electrode layers 610, 620, and 630 is formed of one of molybdenum (Mo), a molybdenum alloy, copper (Cu), a copper alloy, aluminum (Al), and an aluminum alloy.

The passivation layer 700 is disposed on the data electrode layers 610, 620, and 630 to insulate the source electrode 610 and the like from the anode 810 of the OLED 20. The passivation layer 700 has a contact hole, and the anode 810 disposed on the passivation layer 700 contacts the drain electrode 620 through the contact hole of the passivation layer 700. When the passivation layer 700 is formed, a lower layer 710 of a first dam and lower layers 720, 730, and 740 of a plurality of stress distribution portions can be formed together. The passivation layer 700 can be formed of an organic material.

The dam is a structure that prevents an over-coated organic material from overflowing before the organic layer 1400 of the thin film encapsulation layer 10 is hardened. In the current exemplary embodiment, the first dam includes the lower layer 710, an intermediate layer 930, and an upper layer 1120, and a second dam includes a lower layer 920 and an upper layer 1110. The upper layers 1120 and 1110 can include a spacer.

The stress distribution portion is disposed at the edge portion 110, and includes the same layer as at least one of a plurality of insulating layers 700 and 910. In the exemplary embodiment of FIG. 2, a plurality of stress distribution portions disposed in a first stress distribution region 2100 include the same layer as each of the two insulating layers 700 and 910, and a plurality of stress distribution portions disposed in a second stress distribution region 2200 include the same layer as one insulating layer 910.

The first stress distribution region 2100 is a region disposed between the crack preventing portion 40 and the thin film encapsulation layer 10, and the second stress distribution region 2200 is a region disposed between edges of the crack preventing portion 40 and the substrate 100.

Figure 3:
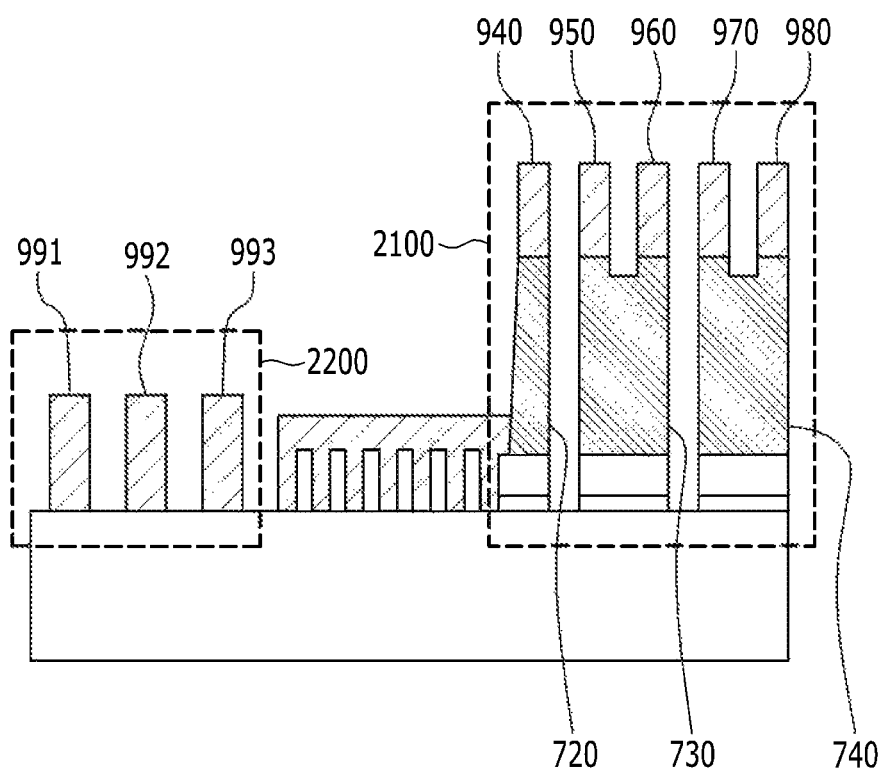
FIG. 3 illustrates an enlarged cross-sectional view of a vicinity of a first stress distribution region and a second stress distribution region of FIG. 2.

FIG. 3 illustrates an enlarged cross-sectional view of a vicinity of the first stress distribution region 2100 and the second stress distribution region 2200 of FIG. 2.

Figure 4A:
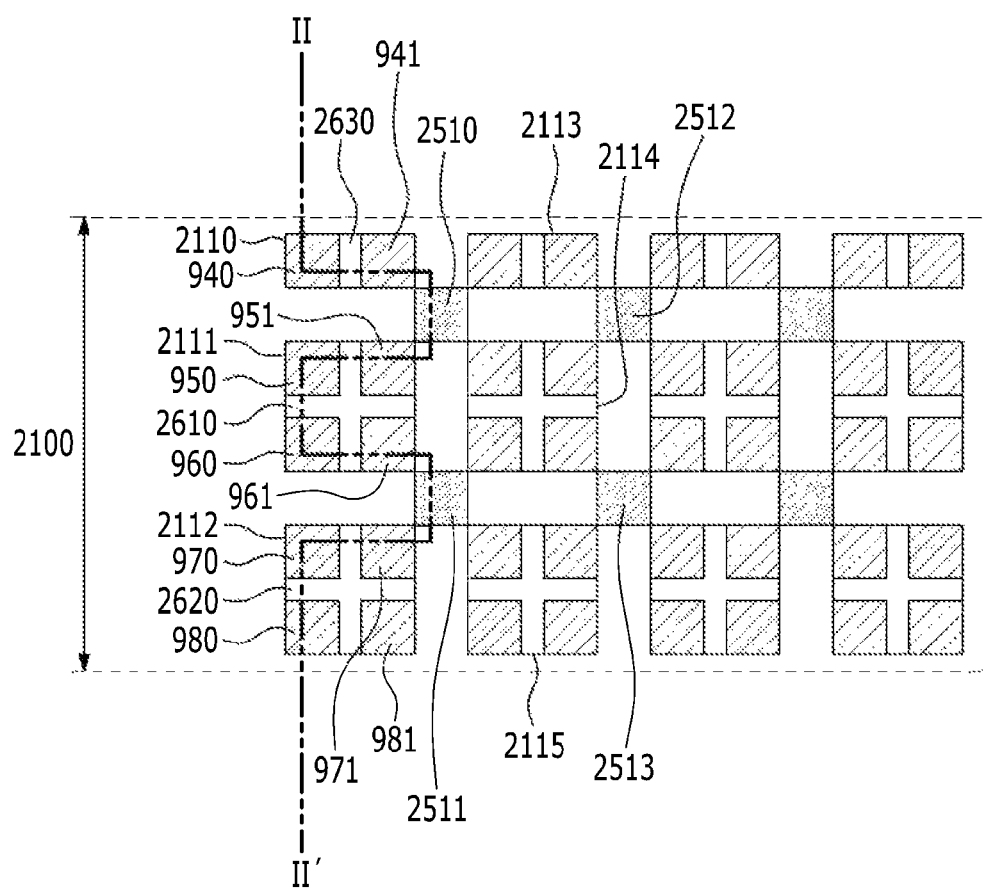
FIG. 4A illustrates a layout view of a stress distribution portion and an opening disposed in the first stress distribution region according to one exemplary embodiment.

Referring to FIGS. 2, 3, and 4A, the first stress distribution region 2100 includes a stress distribution portion A1 (2110), a stress distribution portion B1 (2111), and a stress distribution portion C1 (2112).

The stress distribution portion A1 (2110) includes a lower layer A1 (720) and upper layers A1 (940 and 941), and the upper layers A1 (940 and 941) have a groove A1 (2630). The stress distribution portion B1 (2111) includes a lower layer B1 (730) and upper layers B1 (950, 951, 960, and 961), and the upper layers B1 (950, 951, 960, and 961) have a cross-shaped groove B1 (2610). The stress distribution portion C1 (2112) includes a lower layer C1 (740) and upper layers C1 (970, 971, 980, and 981), and the upper layers C1 (970, 971, 980, and 981) have a cross-shaped groove C1 (2620). Here, the groove A1 (2630), the groove B1 (2610), and the groove C1 (2620) do not limit shapes of the upper layers A1 (940 and 941), the upper layers B1 (950, 951, 960, and 961), and the upper layers C1 (970, 971, 980, and 981), but they are examples for showing that the upper layers can be formed in various shapes.

Figure 5:
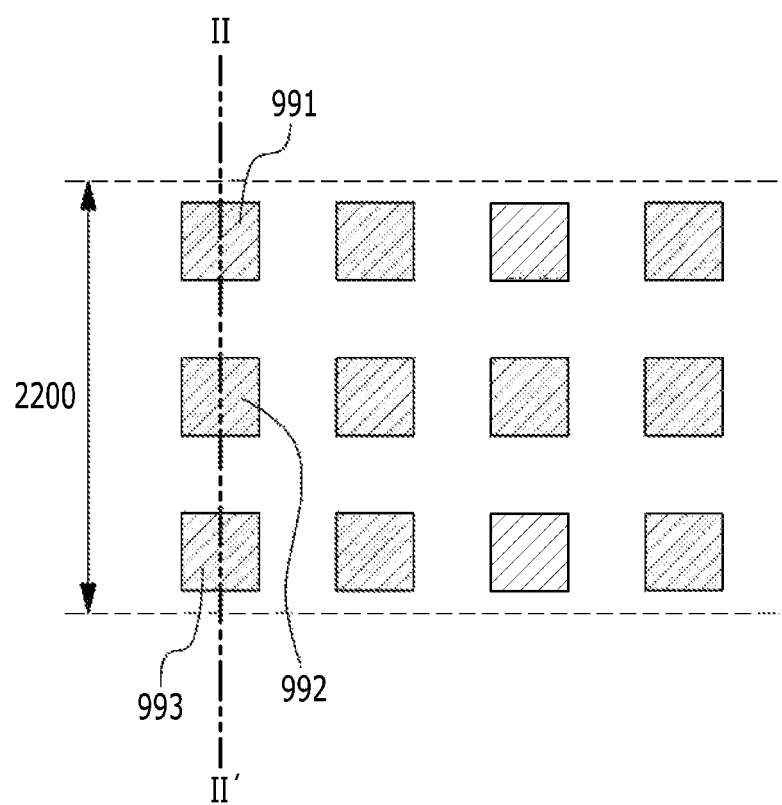
FIG. 5 illustrates a layout view of a stress distribution portion disposed in the second stress distribution region according to one exemplary embodiment.

Referring to FIGS. 2, 3, and 5, the second stress distribution region 2200 includes a stress distribution portion A2

(991), a stress distribution portion B2 (992), and a stress distribution portion C2 (993).

Referring to FIG. 3, in the current exemplary embodiment, the stress distribution portions of the first stress distribution region 2100 respectively include two layers, and the stress distribution portions of the second stress distribution region 2200 respectively include one layer.

While a rolling lamination process of pressing the display panel 4100 with other components is performed, the stress distribution portions according to the current exemplary embodiment effectively distributes stress concentrated on an edge region of the display panel 4100, thus preventing the thin film encapsulation layer 10 from being damaged. Specifically, while performing the rolling lamination process, the stress distribution portions can change a direction of a crack on which the stress is concentrated and propagated and can delay speed thereof. The OLED display according to the current exemplary embodiment prevents the damage generated at the thin film encapsulation layer 10 by the crack, thereby realizing a rigid structure to shrinkage defects.

Layers for anodes 810 and 820 are disposed on the passivation layer 700. The anode 810 contacts the drain electrode 620 through the contact hole formed in the passivation layer 700. The anode 820 electrically connects the electrode 630 and the cathode 1200.

The pixel defining layer 910 for partitioning (or defining) the pixels is disposed on the passivation layer 700 and the anodes 810 and 820. The pixel defining layer 910 includes a plurality of openings defining a region in which organic emission layers 1010, 1020, and 1030 of the OLED 20 are formed in the display area DA. The red, green, and blue organic emission layers 1010, 1020, and 1030 can be disposed in the openings included in the pixel defining layer 910.

When the pixel defining layer 910 is formed, the intermediate layer 930 of the first dam, the lower layer 920 of the second dam, the upper layer A1 (940), the upper layers B1 (950 and 960), the upper layers C1 (970 and 980) of the stress distribution portions of the first stress distribution region 2100, and the stress distribution portions of the second stress distribution region 2200 can be formed together.

The cathode 1200 is disposed on the pixel defining layer 910 and the organic emission layers 1010, 1020, and 1030.

The thin film encapsulation layer 10 in which the inorganic layer 1300, the organic layer 1400, and inorganic layer 1500 are stacked and formed is disposed on the cathode 1200. In the current exemplary embodiment, the thin film encapsulation layer 10 is not disposed at the edge portion 110.

FIG. 4A illustrates a layout view of a plurality of stress distribution portions (2110, 2111, 2112, 2113, 2114, and 2115) and a plurality of openings (2510, 2511, 2512, and 2513) disposed in the first stress distribution region 2100 according to one exemplary embodiment.

The stress distribution portion E1 (2114) can be disposed to be surrounded by the openings (2510, 2511, 2512, 2513). The opening 2510 can be disposed to be surrounded by the stress distribution portion A1 (2110), the stress distribution portion B1 (2111), the stress distribution portion D1 (2113), and the stress distribution portion E1 (2114). The opening (2511) can be disposed to be surrounded by the stress distribution portion B1 (2111), the stress distribution portion C1 (2112), the stress distribution portion E1 (2114), and the stress distribution portion F1 (2115). The remaining stress distribution portions can also be disposed to be surrounded by the openings, as long as a space and an arrangement are allowed. In the same manner, the remaining openings can also be disposed to be surrounded by the stress distribution portions, as long as a space and an arrangement are allowed.

Accordingly, the stress applied to the stress distribution portions can be effectively distributed. The stress distribution portions (2110, 2111, 2112, 2113, 2114, and 2115) can be configured to distribute the stress through various arrangements as well as the arrangement of FIG. 4A. To explain this, FIG. 4B will further be referred to.

Figure 4B:
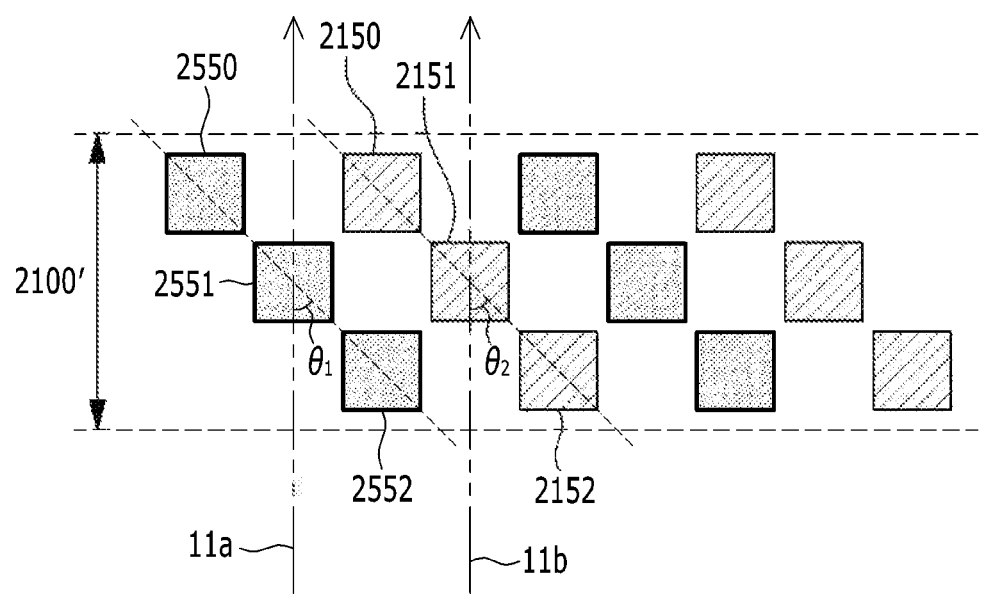
FIG. 4B illustrates a layout view of a stress distribution portion and an opening disposed in the first stress distribution region according to another exemplary embodiment.

FIG. 4B illustrates a layout view of stress distribution portions 2150, 2151, and 2152 and openings 2550, 2551, and 2552 disposed in a first stress distribution region 2100' according to another exemplary embodiment.

Referring to FIG. 4B, the openings 2550, 2551, and 2552 are disposed in a direction forming a first angle ($\theta_1$) based on a first direction 11a toward the edge portion 110 from a center of the substrate 100. The openings 2550, 2551, and 2552 form one array, and other openings can form another array. Accordingly, a plurality of arrays can be formed by the openings. The arrays formed by the openings can be referred to as a plurality of first arrays.

The stress distribution portions 2150, 2151, and 2152 are disposed in a direction forming a second angle (GO based on a second direction 11b toward the edge portion 110 from a center of the substrate 100. The stress distribution portions 2150, 2151, and 2152 form one array, and other stress distribution portions can form another array. Accordingly, a plurality of arrays can be formed by the stress distribution portions. The arrays formed by the stress distribution portions can be referred to as a plurality of second arrays.

The first arrays and the second arrays can be alternately disposed along a direction substantially perpendicular to (or crossing) the first direction.

When the substrate 100 is circular, the opening 2550, 2551, and 2552 and the stress distribution portions 2150, 2151, and 2152 are each disposed as arrays, and they can be disposed to be inclined at a predetermined angle from a radial direction based on the center thereof. Of course, in another exemplary embodiment, the openings 2550, 2551, and 2552 and the stress distribution portions 2150, 2151, and 2152 each are disposed as arrays, and they can be disposed in arrays corresponding to the radial direction.

In one exemplary embodiment, the first angle ($\theta_1$) and the second angle ($\theta_2$) can be substantially the same.

FIG. 5 illustrates a layout view of a stress distribution portion disposed in a second stress distribution region 2200 according to one exemplary embodiment.

Referring to FIG. 5, a plurality of stress distribution portions including the stress distribution portion A2 (991), the stress distribution portion B2 (992), and the stress distribution portion C2 (993) are arranged in a matrix form. In another exemplary embodiment, similar to first stress distribution region 2100 of FIGS. 4A and 4B, the stress distribution portions of the second stress distribution region 2200 can be arranged in various forms while including openings.

Figure 6A:
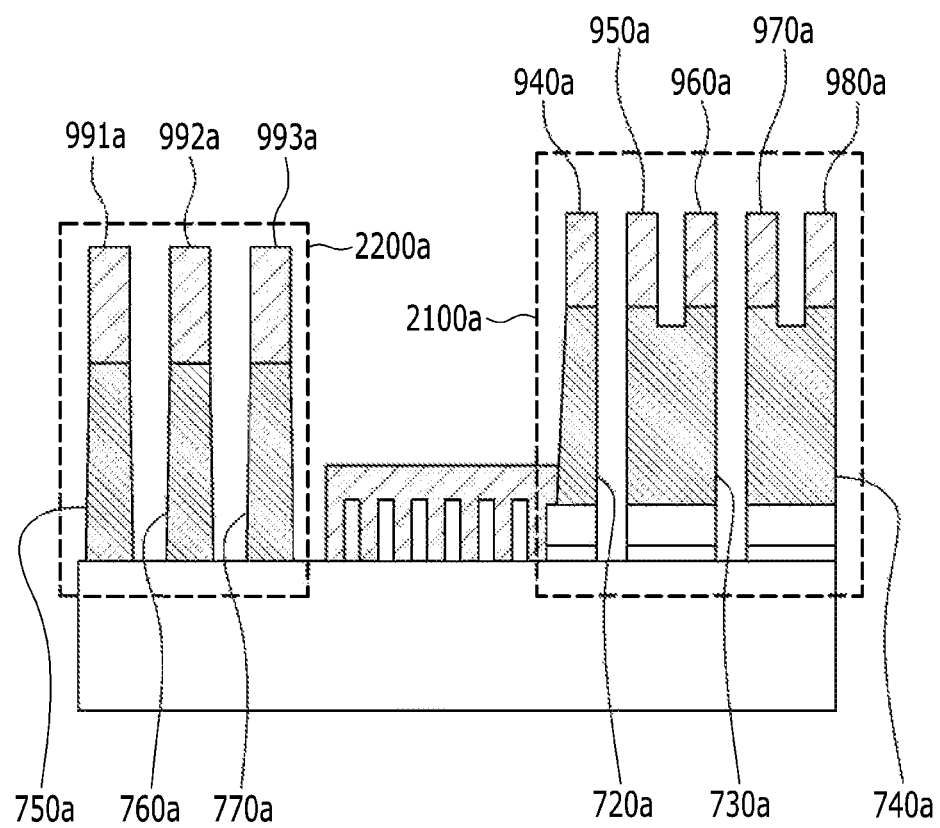
FIG. 6A illustrates an enlarged cross-sectional view of a vicinity of the first stress distribution region and the second stress distribution region according to another exemplary embodiment.
Figure 6B:
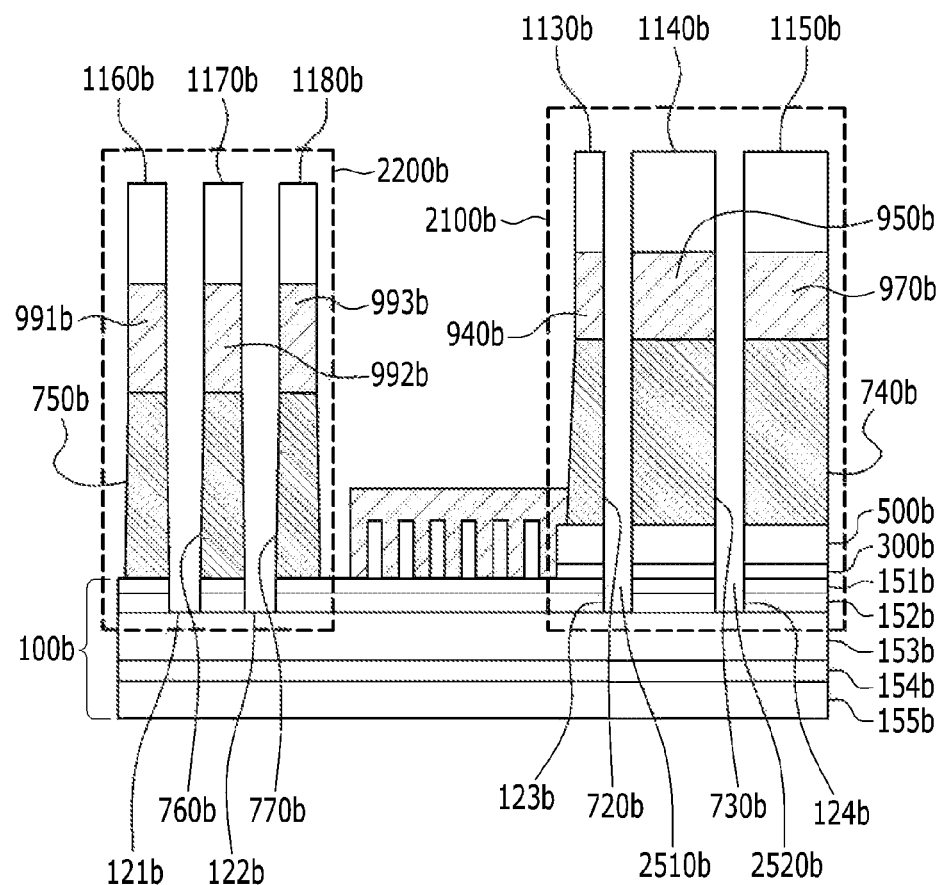
FIG. 6B illustrates an enlarged cross-sectional view of a vicinity of the first stress distribution region and the second stress distribution region according to a further exemplary embodiment.

FIG. 6A illustrates an enlarged cross-sectional view of a vicinity of a first stress distribution region 2100a and a second stress distribution region 2200a according to another exemplary embodiment. FIG. 6B illustrates an enlarged cross-sectional view of a vicinity of a first stress distribution region 2100b and a second stress distribution region 2200b according to a further exemplary embodiment.

Referring to FIG. 6A, a plurality of stress distribution portions of the first stress distribution region 2100a and a plurality of stress distribution portions of the second stress distribution region 2200a can be respectively formed to have a two-layered structure. The stress distribution portions of the first stress distribution region 2100a include lower layers 720a, 730a, and 740a and upper layers 940a, 950a, 960a, 970a, and 980a. The stress distribution portions of the second stress distribution region 2200a include lower layers 750a, 760a, and 770a and upper layer 991a, 992a, and 993a.

The lower layers 720a, 730a, 740a, 750a, 760a, and 770a, when the passivation layer 700 is formed, can be formed together while including the same layer as the passivation layer 700. The upper layers 940a, 950a, 960a, 970a, 980a, 991a, 992a, and 993a, when the pixel defining layer 910 is formed, can be formed together while including the same layer as the pixel defining layer 910.

Referring to FIG. 6B, a plurality of stress distribution portions of the first stress distribution region 2100b and a plurality of stress distribution portions of the second stress distribution region 2200b can respectively formed to have a three-layered structure. The stress distribution portions of the first stress distribution region 2100b include lower layers 720b, 730b, and 740b, intermediate layers 940b, 950b, and 970b, and upper layers 1130b, 1140b, and 1150b. The stress distribution portions of the second stress distribution region 2200b include lower layers 750b, 760b, and 770b, intermediate layers 991b, 992b, and 993b, and upper layers 1160b, 1170b, and 1180b.

The lower layers 720b, 730b, 740b, 750b, 760b, and 770b, when the passivation layer 700 is formed, can be formed together while including the same layer as the passivation layer 700. The intermediate layers 940b, 950b, 970b, 991b, 992b, and 993b, when the pixel defining layer 910 is formed, can be formed together while including the same layer as the pixel defining layer 910. The upper layers 1130b, 1140b, 1150b, 1160b, 1170b, and 1180b, when the upper layers 1120 and 1110 of the first and second dams are formed as shown in FIG. 2, can be formed together while including the same layer as the upper layers 1120 and 1110. That is, the upper layers 1130b, 1140b, 1150b, 1160b, 1170b, and 1180b can be formed as spacers.

FIG. 6B illustrates an exemplarily stacked structure of a substrate 100b. The stacked structure of the substrate 100b corresponds to the stacked structure of the substrate 100 exemplarily described with reference to FIG. 2. The substrate 100b includes an organic layer 155b including a polyimide, and an inorganic layer 154b including a silicon oxide (SiOx) and the like, which is a first barrier layer disposed on the organic layer 155b. The substrate 100b also includes an organic layer 153b including a polyimide on the inorganic layer 154b, an inorganic layer 152b including a silicon nitride (SiNx) or a silicon oxide (SiOx), which is a second barrier layer, on the organic layer 153b, and a buffer layer 151b stacked on the inorganic layer 152b.

In the exemplary embodiment of FIG. 2, although the interlayer insulating layer 500 and the gate insulating layer 300 include the openings 2510 and 2520, in the exemplary embodiment of FIG. 6B, an interlayer insulating layer 500b, a gate insulating layer 300b, the buffer layer 151b, and the inorganic layer 152b include openings 2510b and 2520b. In the exemplary embodiment of FIG. 6B, the openings 2510b and 2520b can be formed by substantially simultaneously etching the interlayer insulating layer 500b, the gate insulating layer 300b, the buffer layer 151b, and the inorganic layer 152b. In this case, the openings of the buffer layer 151b and the inorganic layer 152b included in the substrate 100b are referred to as recess portions 123b and 124b of the substrate 100b. The recess portions 123b and 124b are disposed in the first stress distribution region 2100b.

The substrate 100b includes recess portions 121b and 122b disposed in the second stress distribution region 2200b. The recess portions 121b and 122b can perform functions similar to the openings. The recess portions 121b and 122b are openings included in the buffer layer 151b and the inorganic layer 152b included in the substrate 100b. The recess portions 121b and 122b can be formed by being etched together with the openings 2510b and 2520b.

The stress distribution portions formed in two layers or a plurality of layers have a relatively uniform height compared to a plurality of other stress distribution portions configured in one layer and having a greater height than two layers. According to a recent OLED display having a larger display area, the other stress distribution portions configured in one layer and having a greater height than two layers can have a problem that respective heights of the stress distribution portions are non-uniform because of a non-uniformly coated organic material. Accordingly, when it is required that the heights of the stress distribution portions are high, the stress distribution portions can have multiple layers and not a single layer.

Figure 7:
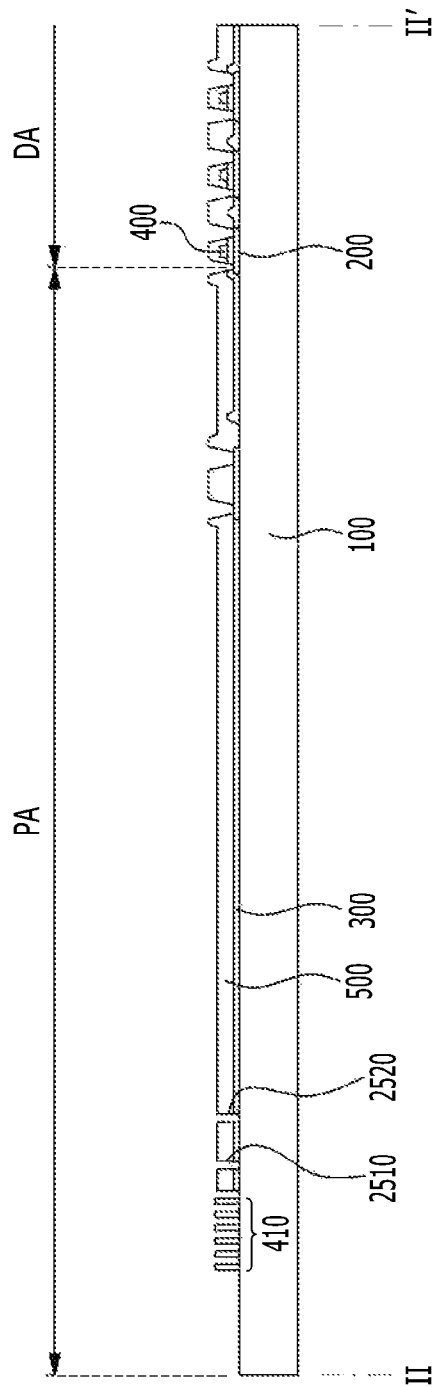
FIGS. 7, 8 and 9 illustrate drawings for explaining a manufacturing method of an OLED display including a stress distribution portion according to one exemplary embodiment.
Figure 8:
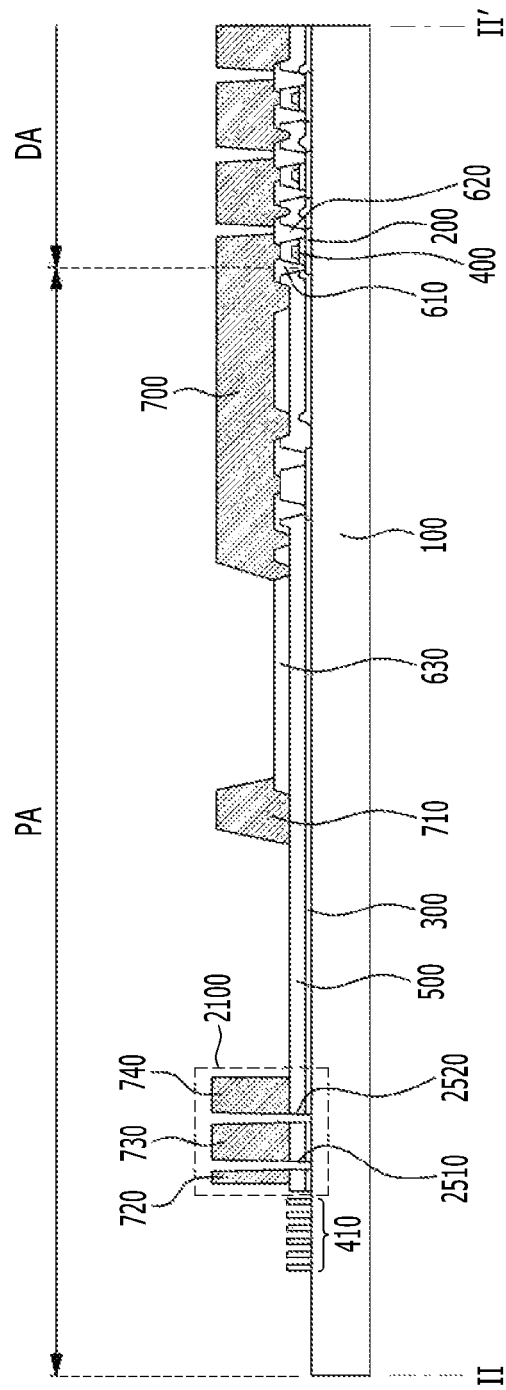
Figure 9:
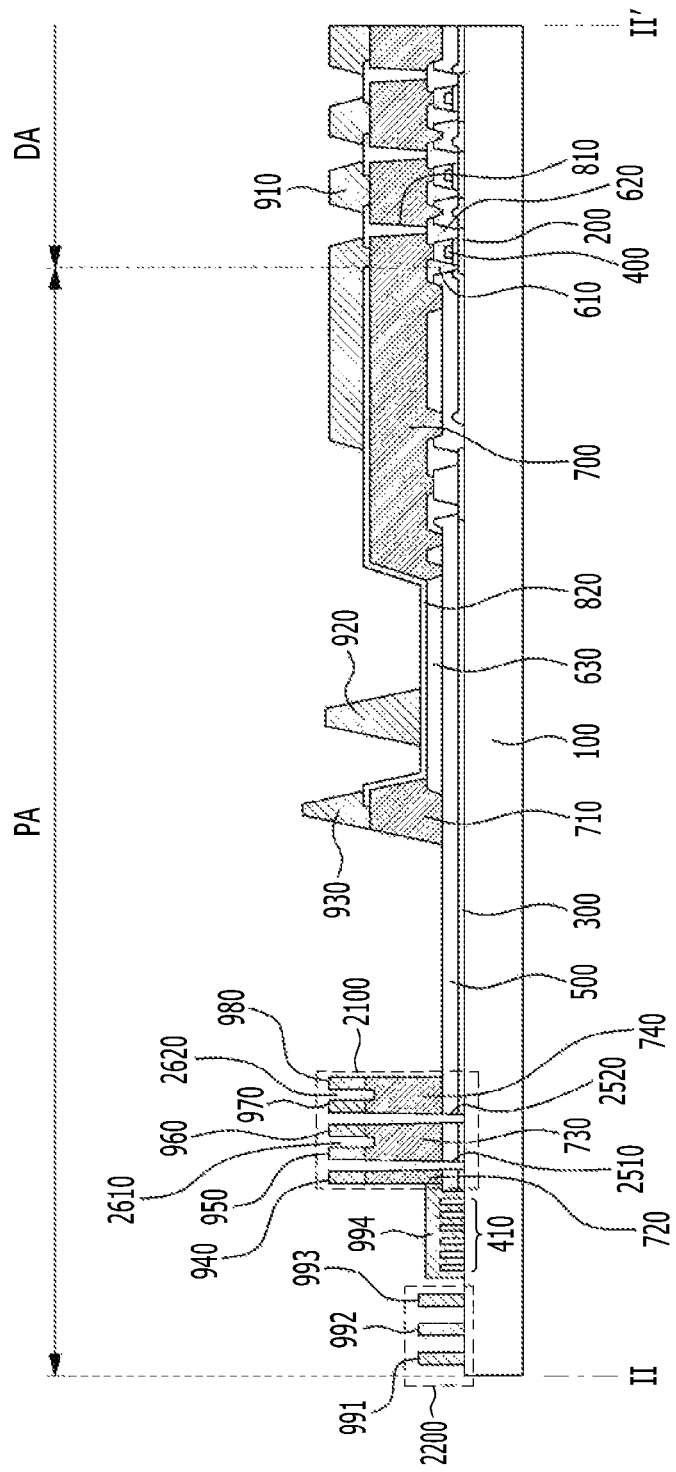

FIGS. 7 to 9 illustrate drawings for explaining a manufacturing method of the OLED display including the stress distribution portions according to one exemplary embodiment. In the explaining of the manufacturing method of FIGS. 7 to 9, the contents described in detail with reference to FIGS. 1A to 6B will be omitted.

Referring to FIG. 7, the semiconductor layer 200 for forming the channel of the transistor is formed on the substrate 100. The semiconductor layer 200 is formed with a predetermined thickness to form a functional layer such as the channel of the transistor in the display area DA, and can be formed with a predetermined thin thickness in the peripheral area PA. The semiconductor layer 200 can be etched to have a predetermined shape.

The gate insulating layer 300 is formed on the semiconductor layer 200. The gate insulating layer 300 can be formed as a reference of a region in which the metal pattern 410 is formed.

The gate electrode 400 is formed by forming and patterning the metal layer on the gate insulating layer 300. In this case, the metal pattern 410 can be formed together therewith.

The interlayer insulating layer 500 is formed on the gate insulating layer 300 and the gate electrode 400. The formed interlayer insulating layer 500 can be substantially simultaneously dry-etched with the gate insulating layer 300 to form a contact hole exposing the semiconductor layer 200. In this case, the openings 2510 and 2520 can be formed together.

Referring to FIG. 8, the data electrode layers 610, 620, and 630 including the electrode 630, the source electrode 610, and the drain electrode 620 are formed. The insulating layers are formed on the data electrode layers 610, 620, and 630, and the insulating layers can include the passivation layer 700. When the passivation layer 700 is formed, the lower layer 710 of the first dam and the lower layers 720, 730, and 740 of the stress distribution portions of the first stress distribution region 2100 can be formed in the same layer as the passivation layer 700. The passivation layer 700 can be formed of an organic material.

Referring to FIG. 9, after forming the passivation layer 700, the anode layers 810 and 820 are formed and etched. The pixel defining layer 910 is formed on the formed anode layers 810 and 820. When the pixel defining layer 910 is formed, the intermediate layer 930 of the first dam, the lower layer 920 of the second dam, the upper layers 940, 950, 960, 970, and 980 of the stress distribution portions of the first stress distribution region 2100, and the stress distribution portions 991, 992, and 993 of the second stress distribution region 2200, are formed together. The pixel defining layer 910 can be formed of an organic material.

Figure 10:
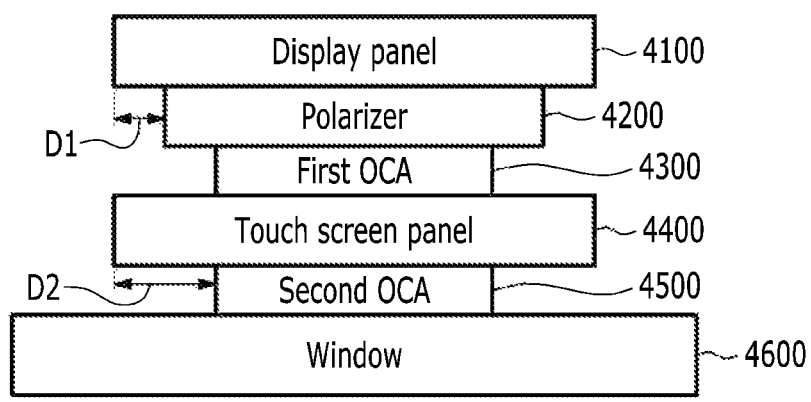
FIG. 10 illustrates a drawing for explaining a stacked structure of an OLED display including a display panel according to one exemplary embodiment.

FIG. 10 illustrates a drawing for explaining a stacked structure of an OLED display including the display panel according to one exemplary embodiment.

Referring to FIG. 10, an OLED display can include the display panel 4100, a polarizer 4200, a first optically clear adhesive (OCA) 4300, a touch screen panel 4400, a second OCA 4500, and a window 4600.

The polarizer 4200 serves to prevent display quality from deteriorating due to reflection of external light inputted from the window 4600. In the OLED display, the external light is reflected by the electrodes of the transistor 30 and the OLED 20, and when the reflected external light interferes with light emitted by the OLED 20, a user may not correctly view the display image of the OLED display.

The polarizer 4200 is configured to use the principle of linear polarization and phase delay, thereby preventing the reflection of the external light. The polarizer 4200 can include a circularly polarizing plate.

The first OCA (Optically Clear Adhesive) 4300 and the second OCA 4500 are adhesive films, and the first OCA 4300 bonds the polarizer 4200 to the touch screen panel 4400 and the second OCA 4500 bonds the touch screen panel 4400 to the window 4600.

The touch screen panel 4400 is an input device sensing a user's touch. In the current exemplary embodiment, although the touch screen panel 4400 and the display panel 4100 are separately illustrated, the touch screen panel 4400 and the display panel 4100 can be integrally formed. When the touch screen panel 4400 is not required in the OLED display, for example for a configuration of a television, the touch screen panel 4400 and the second OCA 4500 can be omitted.

Hereinafter, a distance D1 that is a length difference between the edge of the display panel 4100 and the edge of the polarizer 4200 and a distance D2 that is a length difference between the edge of the touch screen panel 4400 and the edge of the second OCA 4500 will be described with reference to FIG. 11A and FIG. 11B.

Figure 11A:
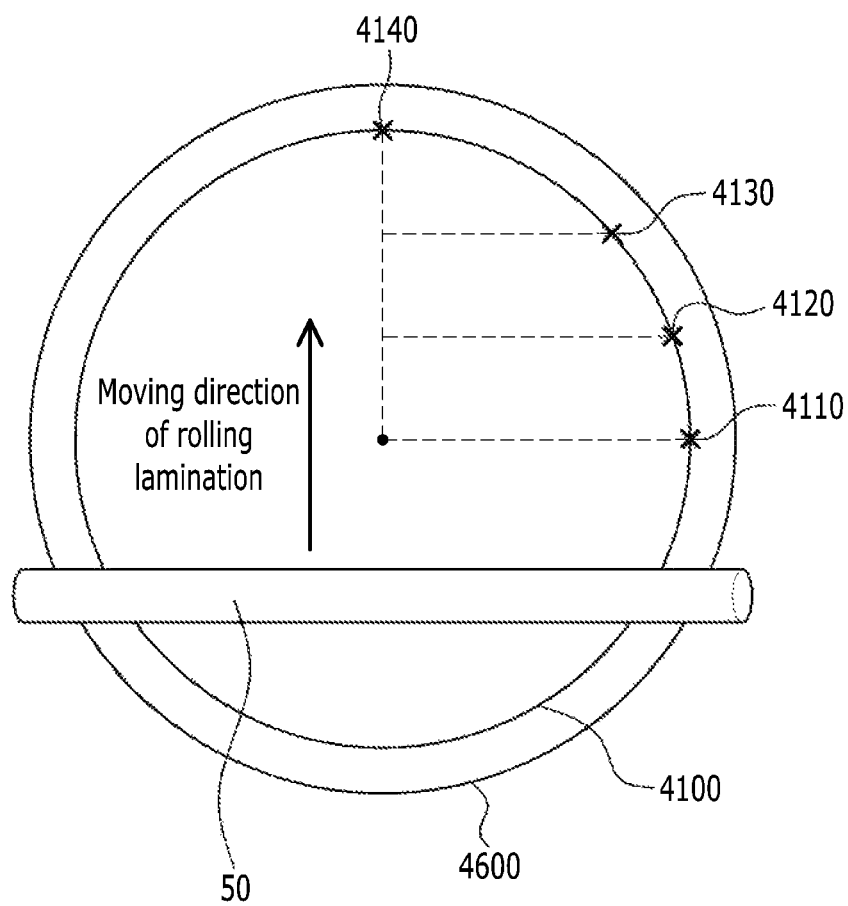
FIGS. 11A and 11B illustrate drawings for explaining stress occurring when a rolling lamination process is performed for the OLED display of FIG. 10.
Figure 11B:
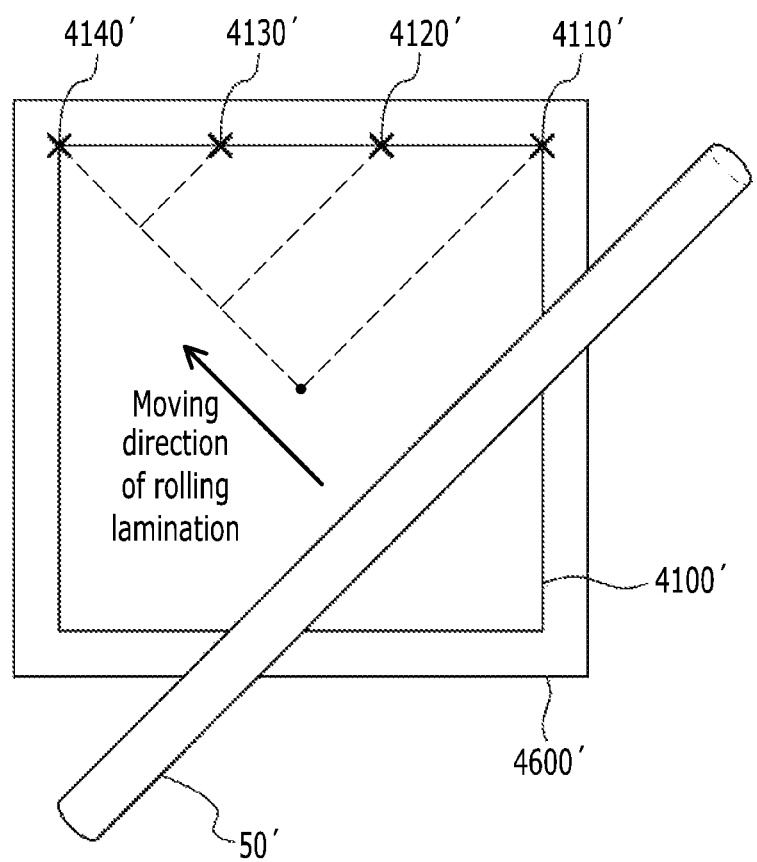

FIGS. 11A and 11B illustrate drawings for explaining stress occurring when a rolling lamination process is performed for the OLED display of FIG. 10.

As shown in FIG. 11A, a rolling lamination process for the display panel 4100 of the circular OLED display is performed by using a roller 50.

According to experimental results of the rolling lamination process shown in FIG. 11A, the occurrence of maximum stress is measured at about 3.51 MPa at a center position 4110 of the display panel 4100 at which an area contacting the roller 50 is the maximum. Also, the occurrence of maximum stress is measured at about 3.61 MPa at a position 4120 of the display panel 4100 at which the area contacting the roller 50 is two thirds. Further, the occurrence of maximum stress is measured at about 4.10 MPa at a position 4130 of the display panel 4100 at which the area contacting the roller 50 is one third. Also, the occurrence of maximum stress is measured at about 97.90 MPa at an end position 4140 of the rolling lamination process. That is, extremely high stress is measured at the end position 4140 of the rolling lamination process compared to other positions.

When the rolling lamination process is performed in the circular OLED display, since there are one or more positions 4140 at which the occurrence of maximum stress occurs, a method that can solve such stress is required.

The measured results for the occurrence maximum stress based on the distances D1 and D2 at the position 4140 are the same.

When the distance D2 is about 300 um and the distance D1 is about 300 um, the occurrence of maximum stress is measured at about 108.17 MPa. When the distance D2 is about 300 um and the distance D1 is about 150 um, the occurrence of maximum stress is measured at about 97.90 MPa. When the distance D2 is about 300 um and the distance D1 is 0 um, the occurrence of maximum stress is measured at about 90.63 MPa. Accordingly, as the distance D1 decreases, it can be seen that the occurrence of maximum stress decreases.

When the distance D1 is about 300 um and the distance D2 is about 300 urn, the occurrence of maximum stress is measured at about 97.90 MPa. When the distance D1 is about 300 um and the distance D2 is about 150 um, the occurrence of maximum stress is measured at about 97.90 MPa. When the distance D1 is about 300 um and the distance D2 is 0 um, the occurrence of maximum stress is measured at about 97.90 MPa. Accordingly, it can be seen that the distance D2 does not affect the occurrence of maximum stress.

Accordingly, in order to reduce the distance D1, at least some of the polarizer 4200 can overlap the first stress distribution region.

Also, at least some of the polarizer 4200 can be overlapped with the first stress distribution region and the second stress distribution region.

As shown in FIG. 11B, a rolling lamination process for the quadrangular display panel 4100' of the OLED display is performed by using a roller 50'.

According to experimental results of the rolling lamination process shown in FIG. 11B, it can be seen that occurrence of maximum stress at a position 4110' is less than occurrence of maximum stress at a position 4120'. Also, the occurrence of maximum stress at a position 4120' is less than occurrence of maximum stress at a position 4130'. Further, the occurrence of maximum stress at a position 4130' is less than occurrence of maximum stress at a position 4140'.

Accordingly, even in the exemplary embodiment of FIG. 11B, since occurrence of maximum stress is the greatest at the position 4140' that is the angular edge portion, the current exemplary embodiment can be applied thereto.

The accompanying drawings and the detailed description of the disclosure are only illustrative, and are used for the purpose of describing the present disclosure but are not used to limit the meanings or scope of the present disclosure described in the claims. Therefore, those skilled in the art will understand that various modifications and other equivalent embodiments of the present disclosure are possible. Consequently, the true technical protective scope of the present disclosure must be determined based on the technical spirit of the appended claims.

What is claimed is:

1. An organic light-emitting diode (OLED) display, comprising:
    a substrate including a display area configured to display an image, a peripheral area surrounding the display area, and an edge portion disposed at the peripheral area and having a curved shape or an angular shape;
    a plurality of pixels disposed at the display area and including a plurality of transistors and a plurality of insulating layers disposed over the transistors;

a thin film encapsulation layer covering the pixels in the display area and at least a portion of the peripheral area; and at least one recess or protrusion pattern disposed at the edge portion between a crack preventing portion and a dam and including at least one of the insulating layers.

2. The OLED display of claim 1, wherein the pixels include a plurality of OLEDs, and wherein the insulating layers include:

a passivation layer disposed between the transistors and the OLEDs; and a pixel defining layer that define the pixels.

3. The OLED display of claim 2, wherein the transistors include a plurality of gate electrodes, the OLED display further comprising:

a semiconductor layer formed over the substrate;

a gate insulating layer disposed between the semiconductor layer and the gate electrodes; and an interlayer insulating layer disposed over the gate electrodes and the gate insulating layer, wherein at least one of the gate insulating layer and the interlayer insulating layer at least partially covers the edge portion and includes an opening disposed at the partially covered area of the edge portion.

4. An organic light-emitting diode (OLED) display, comprising:

a substrate including a display area configured to display an image, a peripheral area surrounding the display area, and an edge portion disposed at the peripheral area and having a curved shape or an angular shape;

a plurality of pixels disposed at the display area and including a plurality of transistors and a plurality of insulating layers disposed over the transistors, wherein the transistors include a plurality of gate electrodes;

a thin film encapsulation layer covering the pixels in the display area and at least a portion of the peripheral area;

at least one recess or protrusion pattern disposed at the edge portion and including at least one of the insulating layers;

a semiconductor layer formed over the substrate;

a gate insulating layer disposed between the semiconductor layer and the gate electrodes; and an interlayer insulating layer disposed over the gate electrodes and the gate insulating layer, wherein the pixels include a plurality of OLEDs, and wherein the insulating layers include:

a passivation layer disposed between the transistors and the OLEDs; and a pixel defining layer that define the pixels, wherein at least one of the gate insulating layer and the interlayer insulating layer at least partially covers the edge portion and includes an opening disposed at the partially covered area of the edge portion, and wherein the opening comprises a plurality of openings, wherein the at least one recess or protrusion pattern comprises a plurality of recess or protrusion patterns and the openings, wherein each of the recess or protrusion patterns is surrounded by at least two of the openings, and wherein each of the openings is surrounded by at least two of the recess or protrusion patterns.

5. The OLED display of claim 4, wherein the opening comprises a plurality of openings, wherein the substrate includes a buffer layer and an inorganic layer, wherein the edge portion includes a recess portion disposed at a periphery of the at least one recess or protrusion pattern and including the openings, and wherein the recess portion is formed in the buffer layer and the inorganic layer.

6. The OLED display of claim 4, wherein the openings are arranged in a plurality of first arrays and disposed in a direction that forms a first angle with a first direction, and wherein the recess or protrusion patterns are arranged in a plurality of second arrays and disposed in a direction that forms a second angle with the first direction.

7. The OLED display of claim 6, wherein the first and second arrays are alternately disposed along a direction crossing the first direction.

8. The OLED display of claim 7, wherein the edge portion includes a crack preventing portion disposed adjacent to the gate and interlayer insulating layers and includes a metal pattern, wherein each of the recess or protrusion patterns is disposed in at least one of a first stress distribution region and a second stress distribution region, wherein the first stress distribution region is disposed between the crack preventing portion and the thin film encapsulation layer, and wherein the second stress distribution region is disposed between the crack preventing portion and an edge of the substrate.

9. The OLED display of claim 8, further comprising a polarizer disposed over the thin film encapsulation layer, wherein at least a portion of the polarizer overlaps the first stress distribution region in the depth dimension of the OLED display.

10. The OLED display of claim 9, wherein at least one recess or protrusion pattern in the first stress distribution region is taller than the recess or protrusion patterns in the second stress distribution region.

11. The OLED display of claim 10, wherein the first stress distribution region is closer to the display area than the second stress distribution region.

12. The OLED display of claim 11, wherein the first stress distribution region includes the interlayer insulating layer, and wherein the second stress distribution region does not include the interlayer insulating layer.

13. The OLED display of claim 12, wherein the first stress distribution region includes the gate insulating layer, and wherein the second stress distribution region does not include the gate insulating layer.

14. An organic light-emitting diode (OLED) display, comprising:

a substrate including a display area configured to display an image, a peripheral area surrounding the display area, and an edge portion disposed at the peripheral area and having a curved shape or an angular shape;

a plurality of pixels disposed at the display area and including a plurality of transistors and a plurality of insulating layers disposed over the transistors;

a thin film encapsulation layer covering the pixels in the display area and at least a portion of the peripheral area;

at least one recess or protrusion pattern disposed at the edge portion and including at least one of the insulating layers; and a polarizer disposed over the thin film encapsulation layer, wherein at least a portion of the polarizer overlaps the at least one recess or protrusion pattern in the depth dimension of the OLED display.

* * * * *